(12) United States Patent
Hong

(10) Patent No.: US 9,117,907 B2
(45) Date of Patent: Aug. 25, 2015

(54) SEMICONDUCTOR DEVICE

(71) Applicant: SEMICONDUCTOR MANUFACTURING INTERNATIONAL CORP., Shanghai (CN)

(72) Inventor: Zhongshan Hong, Shanghai (CN)

(73) Assignee: SEMICONDUCTOR MANUFACTURING INTERNATIONAL CORP, Shanghai (CN)

( * ) Notice: Subject to any disclaimer, the term of this patent is extended or adjusted under 35 U.S.C. 154(b) by 0 days.

(21) Appl. No.: 14/607,613

(22) Filed: Jan. 28, 2015

(65) Prior Publication Data
US 2015/0145045 A1    May 28, 2015

Related U.S. Application Data

(62) Division of application No. 13/686,019, filed on Nov. 27, 2012, now Pat. No. 8,975,167.

(30) Foreign Application Priority Data

May 14, 2012 (CN) .......................... 2012 1 0149373

(51) Int. Cl.
| | | |
|---|---|---|
| H01L 27/12 | (2006.01) | |
| H01L 29/78 | (2006.01) | |
| H01L 21/36 | (2006.01) | |
| H01L 29/06 | (2006.01) | |
| H01L 29/10 | (2006.01) | |
| H01L 29/16 | (2006.01) | |
| H01L 29/161 | (2006.01) | |
| H01L 29/20 | (2006.01) | |
| H01L 29/49 | (2006.01) | |
| H01L 29/51 | (2006.01) | |
| H01L 29/66 | (2006.01) | |

(52) U.S. Cl.
CPC .............. *H01L 29/785* (2013.01); *H01L 21/36* (2013.01); *H01L 29/0649* (2013.01); *H01L 29/1033* (2013.01); *H01L 29/16* (2013.01); *H01L 29/161* (2013.01); *H01L 29/1608* (2013.01); *H01L 29/20* (2013.01); *H01L 29/495* (2013.01); *H01L 29/4966* (2013.01); *H01L 29/51* (2013.01); *H01L 29/517* (2013.01); *H01L 29/518* (2013.01); *H01L 29/66795* (2013.01); *H01L 29/78* (2013.01); *H01L 29/66545* (2013.01)

(58) Field of Classification Search
None
See application file for complete search history.

(56) References Cited

U.S. PATENT DOCUMENTS 8,258,587 B2    9/2012    Masuoka et al.

*Primary Examiner* — Marvin Payen
(74) *Attorney, Agent, or Firm* — Anova Law Group, PLLC

(57) ABSTRACT

A fabrication process of a semiconductor device is disclosed. The method includes providing a semiconductor substrate with a first insulation layer formed on the semiconductor substrate and a fin formed on the surface of the first insulation layer, and forming a fully-depleted semiconductor layer on sidewalls of the fin, and the fully-depleted semiconductor layer having a material different from that of the fin. The method also includes forming a second insulation layer covering the fully-depleted semiconductor layer, and removing the fin to form an opening exposing sidewalls of the fully-depleted semiconductor layer. Further, the method includes forming a gate dielectric layer on part of the sidewalls of the fully-depleted semiconductor layer such that the part of the sidewalls of the fully-depleted semiconductor layer form channel regions of the semiconductor device, and forming a gate electrode layer covering the gate dielectric layer.

8 Claims, 6 Drawing Sheets

SEMICONDUCTOR DEVICE

CROSS REFERENCE TO RELATED APPLICATIONS

This application is a divisional of U.S. patent application Ser. No. 13/686,019, filed on Nov. 27, 2012, which claims priority to Chinese Patent Application No. 201210149373.6, filed on May 14, 2012, all of which are incorporated herein by reference in their entirety.

FIELD OF THE INVENTION

The present invention generally relates to semiconductor technologies and, more particularly, to semiconductor devices and manufacturing methods.

BACKGROUND

There are various existing methods to manufacture metal-oxide-semiconductor (MOS) devices. For example, as shown in FIG. 1, a current method to form a MOS device includes: providing a semiconductor substrate 100; covering the surface of the semiconductor substrate 100 with an insulation layer 101; covering the surface of the insulation layer with a polycrystalline silicon layer 103; covering the surface of the polycrystalline silicon layer 103 with a photoresist layer 105.

Further, as shown in FIG. 2, the current method includes: etching the polycrystalline silicon layer 103 and the insulation layer 101 using the photoresist layer 105 as a mask to expose the substrate 100; forming a polycrystalline silicon layer 103a and an insulation layer 101a, wherein the polycrystalline silicon layer 103a is on the surface of the insulation layer 101a;

As shown in FIG. 3, the current method further includes: after forming the insulation layer 101a and the polycrystalline silicon layer 103a, doping ions are implanted into the semiconductor substrate 100 using the photoresist layer 105 as a mask to form source/drain regions 107.

However, with the development of the semiconductor process technology, the process node decreases gradually, and the gate critical dimensions (CD) also continuously decreases, which may cause the MOS devices manufactured by the current methods to have stability issues. The disclosed methods and systems are directed to solve one or more problems set forth above and other problems.

BRIEF SUMMARY OF THE DISCLOSURE

One aspect of the present disclosure includes a fabrication process of a semiconductor device. The method includes providing a semiconductor substrate with a first insulation layer formed on the semiconductor substrate and a fin formed on the surface of the first insulation layer, and forming a fully-depleted semiconductor layer on sidewalls of the fin, and the fully-depleted semiconductor layer having a material different from that of the fin. The method also includes forming a second insulation layer covering the fully-depleted semiconductor layer, and removing the fin to form an opening exposing sidewalls of the fully-depleted semiconductor layer. Further, the method includes forming a gate dielectric layer on part of the sidewalls of the fully-depleted semiconductor layer such that the part of the sidewalls of the fully-depleted semiconductor layer form channel regions of the semiconductor device, and forming a gate electrode layer covering the gate dielectric layer.

Another aspect of the present disclosure includes a semiconductor device. The semiconductor device includes a semiconductor substrate, a first insulation layer formed on the semiconductor substrate, and a second insulation layer formed on the first insulation layer having at least one opening. The semiconductor device also includes a fully-depleted semiconductor layer forming sidewalls of the opening, a gate dielectric layer, and a gate electrode layer covering the gate dielectric layer. The gate dielectric layer is formed on part of sidewalls of the fully-depleted semiconductor layer such that the part of the sidewalls of the fully-depleted semiconductor layer form channel regions of the semiconductor device.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

The stability issues of the semiconductor devices caused by continuous reduction on the gate critical dimensions (CD) may be solved by a variety ways. One way is to eliminate the interactions between PN junctions and between the devices.

For example, a silicon-on-insulator (SOI) may be used as a substrate for the semiconductor devices to effectively eliminate the interactions between the devices. Specifically, on the basis of the thickness of the silicon film, SOI structures may be divided into a thin-film fully-depleted SOI (FDSOI) structure and a thick-film partially-depleted SOI (PDSOI) structure. An FDSOI structure can have a lower electric field and good short-channel characteristic, thus can more effectively eliminate the interactions between devices and improve the stability of the semiconductor device. However, because the thickness of the silicon film of a thin-film FDSOI structure is subject to the SOI manufacturing process, generally it is difficult to control the uniformity of the thickness of the silicon film of a thin-film FDSOI structure. Thus, it may be costly to manufacture the SOI with a uniform-thickness silicon film of the FDSOI structure.

Another way to improve the stability of semiconductor devices is to increase the gate width while ensuring the IC performance and integration degree. A fin-type field effect transistor (finFET) can have a larger gate width and is gaining wide-spreading attentions recently. However, because a fin portion in the finFET may be thin, the structure on one side of the fin may be vulnerable to the interference from the other side of the fin, thus affecting the performance of the finFET. Certain improvements may be made to increase the performance of the finFET.

Figure 1:
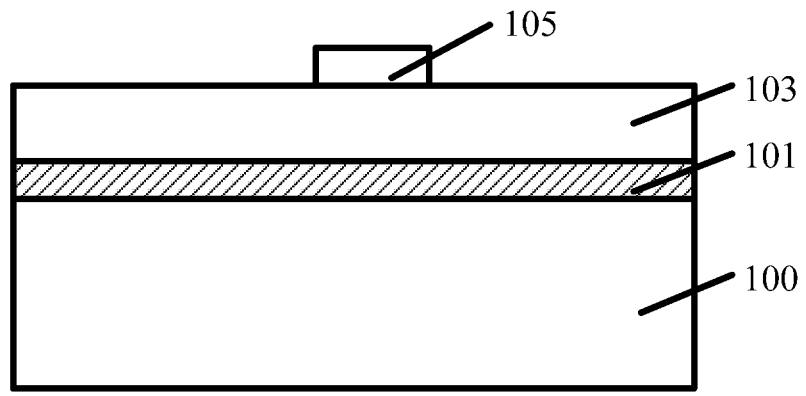
FIGS. 1-3 illustrate cross-section structural diagrams of a current method to form a metal-oxide-semiconductor device.
Figure 2:
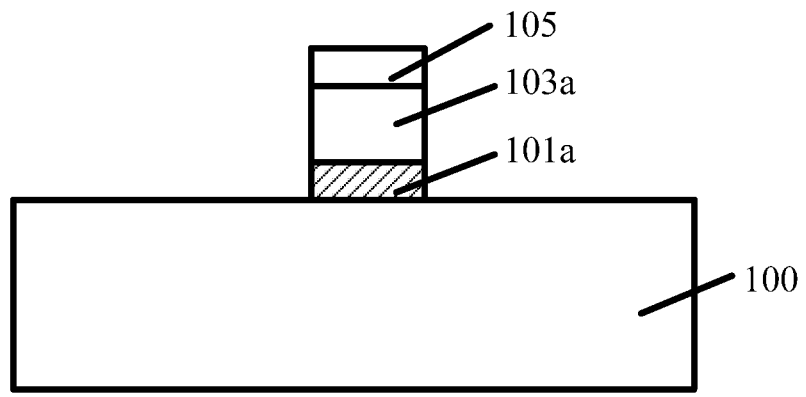
Figure 3:
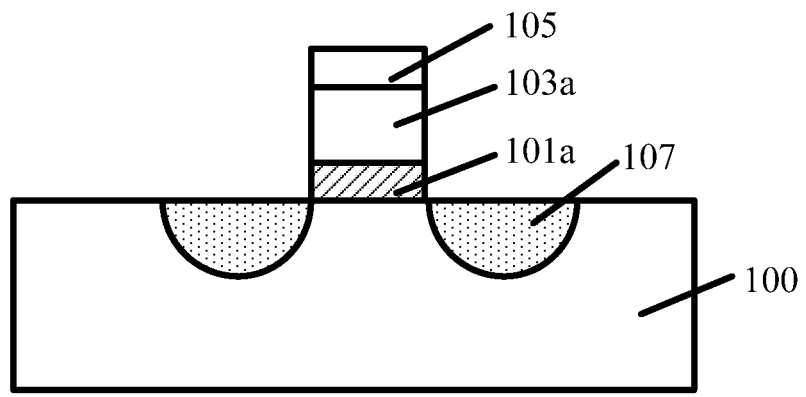
Figure 4:
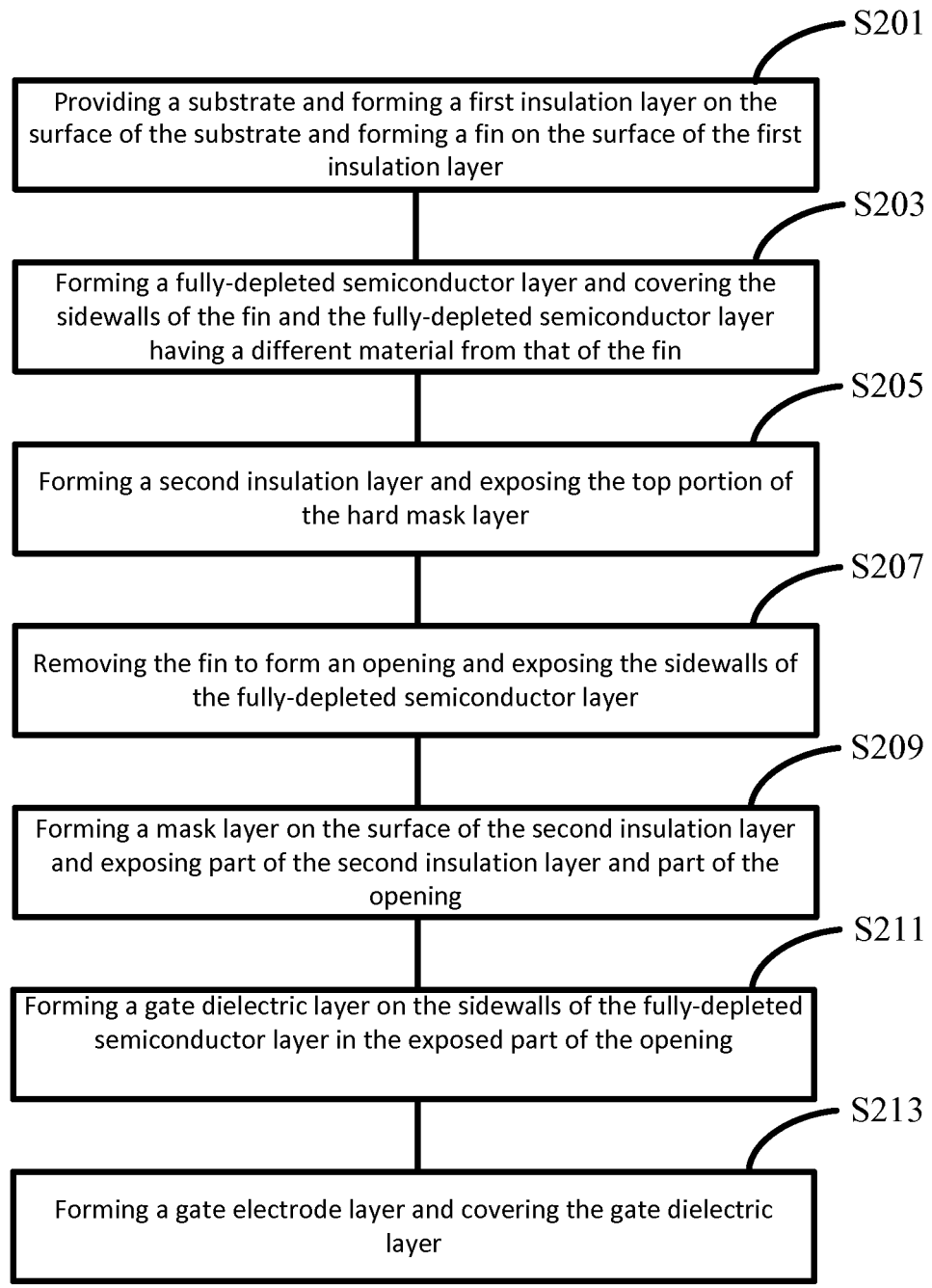
FIG. 4 illustrates a flow diagram of an exemplary semiconductor device manufacturing process consistent with the disclosed embodiments.
Figure 5:
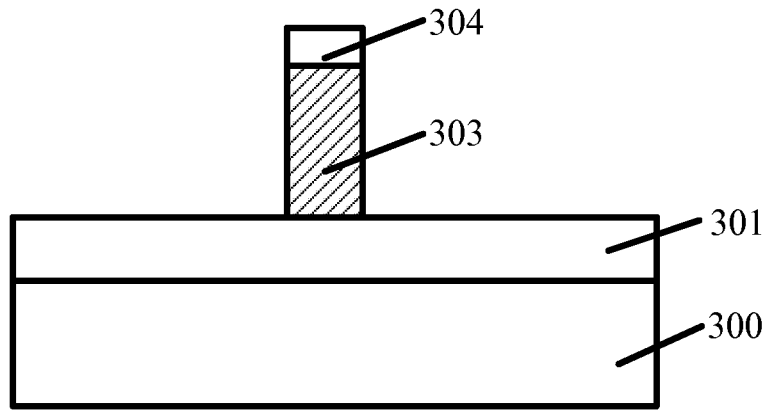
FIGS. 5-10 illustrate cross-section structural diagrams of an exemplary semiconductor device manufacturing process consistent with the disclosed embodiments.

FIG. 4 illustrates a flow diagram of an exemplary semiconductor device manufacturing process consistent with the disclosed embodiments. As shown in FIG. 4, at the beginning of the process, a semiconductor substrate is provided, a first insulation layer is formed on the surface of the semiconductor substrate, and a fin is formed on the surface of the first insulation layer in succession (S201). FIG. 5 shows an exemplary structure corresponding to S201.

As shown in FIG. 5, a semiconductor substrate 300 is provided. The substrate 300 may include any appropriate materials used for semiconductor devices. For example, the materials to form the substrate 300 may include single-crystalline silicon, silicon germanium, silicon carbide, or any combination of the III-V group compounds (gallium arsenide, indium phosphide, gallium nitride, etc.). Other types of substrates may also be used.

The substrate 300 is covered by a first insulation layer 301. Fin 303 is formed on the top surface of the first insulation layer 301, and a hard mask layer 304 is formed on the top surface of the fin 303. The substrate 300 may be configured as the base for subsequent processes.

Further, the first insulation layer 301 is used to insulate or isolate the substrate 300 and subsequently-formed semiconductor devices. The first insulation layer 301 may be made of silicon oxide ($SiO_2$), silicon oxynitride (SiON), or any other appropriate dielectric materials. The first insulation layer 301 may be formed by any appropriate means, such as a deposition process or an oxidation process.

The sidewalls of the fin 303 may define the locations of a subsequent fully-depleted semiconductor layer and the fin 303 will be subsequently removed to form a gate structure. The fin 303 may be made of any appropriate materials including single-crystalline silicon, silicon germanium (SiGe), silicon carbon, carbon doped silicon, or other of the III-V group compounds, such as gallium arsenide (GaAs), indium phosphide (InP), and gallium nitride (GaN), etc. In certain embodiments, the fin 303 may be made of single-crystalline silicon.

The fin 303 may be formed by an etching process. In certain embodiments, the semiconductor substrate 300 may be the back substrate of the SOI structure, and the first insulation layer may be the buried oxide (BOx) layer of the SOI structure. The fin 303 may then be formed by etching the silicon film of the SOI structure, i.e., on the surface of the SOI structure. The SOI structure may be a thick film PDSOI structure. Other structures may also be used.

For example, in certain embodiments, the semiconductor substrate 300 may also be bulk silicon, and the first insulation layer 301 may be formed by a deposition process. The fin 303 may be formed by etching the silicon film (not shown) deposited on the surface of the first insulation layer 301. Further, multiple fins (not shown) may be formed on the surface of the first insulation layer 301 by etching the silicon film deposited on the surface of the first insulation layer 301. The multiple fins may be made of the same type of materials including single-crystalline silicon, silicon germanium (SiGe), silicon carbon, carbon doped silicon, or any of the III-V group compounds, such as gallium arsenide (GaAs), indium phosphide (InP), gallium nitride (GaN), etc. Subsequently, multiple fins may be removed to form multi-gate structures.

Still as shown in FIG. 5, in certain embodiments, the hard mask layer 304 may be formed to cover the top of the fin 303 to avoid the formation of the fully-depleted semiconductor layer on the top of the fin 303 during subsequent manufacturing processes. Further, the hard mask layer 304 may be made of SiN or SiON by a deposition process. In one embodiment, the hard mask layer 304 is made of SiN, and the hard mask layer 304 may also be used as an etching mask to form the fin 303.

Figure 6:
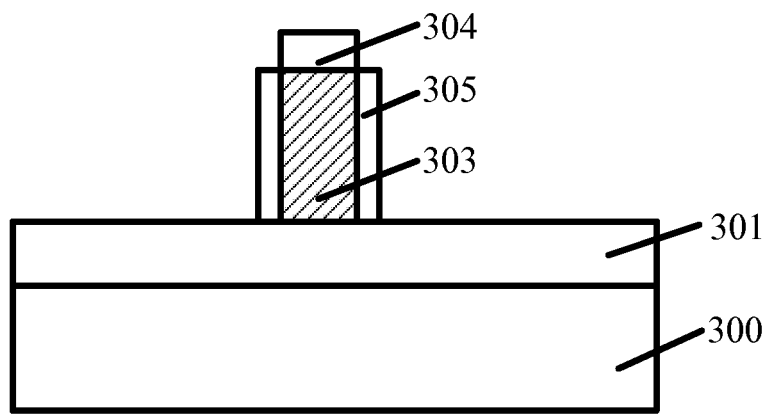

Returning to FIG. 4, after forming the fin 303, a fully-depleted semiconductor layer is formed on the sidewalls of the fin 303, and the fully-depleted semiconductor layer is made of a material different from that of the fin 303 (S203). FIG. 6 shows an exemplary corresponding structure to S203.

As shown in FIG. 6, a fully-depleted semiconductor layer 305 is formed on the sidewalls of the fin 303, and the fully-depleted semiconductor layer 305 is made of a material different from the material of the fin 303.

The fully-depleted semiconductor layer 305 is formed on the sidewalls of the fin 303 to subsequently form the channel region of the semiconductor device. Because the fully-depleted semiconductor layer 305 is relative thin, the channel region formed from the fully-depleted semiconductor layer 305 may be easily conducted, leading to the desired stability of the resulting semiconductor device.

The fully-depleted semiconductor layer 305 may be made of any appropriate materials including single-crystalline silicon, silicon germanium (SiGe), silicon carbon, carbon doped silicon, or any of the III-V group compounds. Further, in order to remove the fin 303 easily during the subsequent manufacturing processes, the fully-depleted semiconductor layer 305 may be made of a material different from that of the fin 303. In one embodiment, the fully-depleted semiconductor layer 305 may be made of single-crystalline silicon germanium (SiGe).

For an SOI structure, when the thickness of the silicon film on the surface of the SOI is small, i.e., a thin-film FDSOI structure, a better performance may be achieved, such as having a lower electric field, a higher transconductance, a better short-channel characteristic, and an ideal sub-threshold slope, etc. However, when a thin fully-depleted semiconductor layer 305 is used to form the channel region, the same effects from the thin-film FDSOI structure can be achieved with the thin fully-depleted semiconductor layer 305. Further, because the fully-depleted semiconductor layer 305 may be formed by a deposition process, it may be easier to control the thickness of the fully-depleted semiconductor layer 305. Thus, the fully-depleted semiconductor layer 305 can have a uniform thickness and the resulting semiconductor device can have better performance. In one embodiment, the fully-depleted semiconductor layer 305 may have a thickness of approximately 1 nm-10 nm for achieving desired device performance.

As described above, the fully-depleted semiconductor layer 305 may be formed by a deposition process, such as a physical deposition or a chemical vapor deposition (CVD). In certain embodiments, the fully-depleted semiconductor layer 305 may be formed by a selective epitaxial deposition process. That is, the atoms used to form the fully-depleted semiconductor layer 305 are deposited on the sidewalls of the fin 303, not on the surface of the first insulation layer 301 or the hard mask layer 304. Thus, the manufacturing process steps are simplified and a desired uniformity of the thickness of the fully-depleted semiconductor layer 305 can be obtained.

Further, to improve the quality of the sidewalls of the fin 303 such that a desired fully-depleted semiconductor layer 305 can be formed using the sidewalls of the fin 303 as the deposition substrate, the manufacturing process may also include: oxidizing the fin 303 to form an oxide layer (not shown) prior to forming the fully-depleted semiconductor layer 305; annealing the oxidized fin 303 using hydrogen gas ($H_2$). In certain embodiments, the oxide layer may have a thickness of approximately 1 nm-5 nm, and the annealing temperature may be in the range of approximately 900-1100° C.

Figure 7:
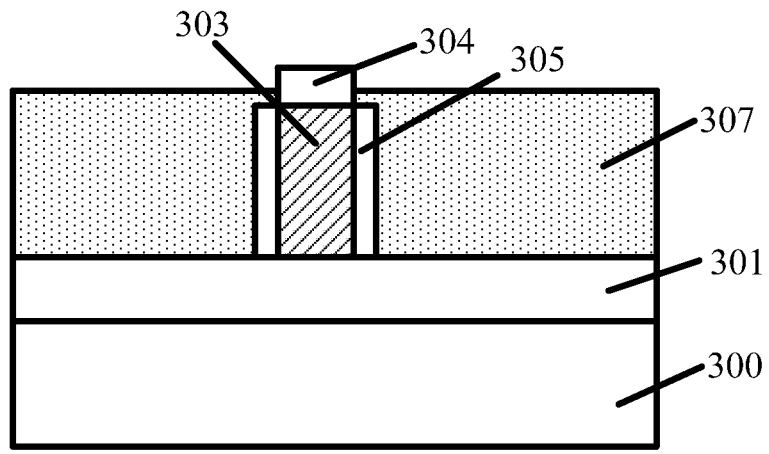

Returning to FIG. 4, after forming the fully-depleted semiconductor layer 305, a second insulation layer is formed over the first insulation layer 301 covering the fin 303 but exposing the hard mask layer 304 (S205). FIG. 7 shows an exemplary structure corresponding to S205.

As shown in FIG. 7, the second insulation layer 307 is formed on the top of the first insulation layer 301 covering the fin 303 while exposing the hard mask layer 304 on the top of the fin 303.

The second insulation layer 307 is used to fill the space around the fin 303 and/or the space between neighboring fins 303 when multiple fins are included such that subsequent gate structures can be formed. During subsequent manufacturing processes, the second insulation layer 307 not only can protect the surface of the fully-depleted semiconductor layer 305, but also can serve as a carrier for the subsequent processes.

The second insulation layer 307 may be made of any appropriate materials, such as silicon oxide, silicon nitride or silicon oxynitride. Further, to protect the second insulation layer 307 during the subsequent process of removing the hard mask layer 304, the second insulation layer 307 may be made of a material different from that of the hard mask layer 304. The second insulation layer 307 may be formed by a deposition process. In certain embodiments, when the ratio of the fin height to the distance between the adjacent fins is relatively large, the second insulation layer 307 may be formed by a flowable chemical vapor deposition (flowable CVD) process.

More particularly, the second insulation layer 307 may be formed by: forming a second insulation thin film (not shown) covering the fin 303, the fully-depleted semiconductor layer 305, and the hard mask layer 304; and removing part of the second insulation thin film to expose the top surface of the hard mask layer 304. Further, the second insulation thin film may be partially removed by a chemical mechanical polishing (CMP) process or an etching process.

Optionally, when the second insulation thin film is removed by a CMP process and after the remaining second insulation thin film levels with the surface of the hard mask layer 304, the surface of the remaining second insulation thin film may be further smoothened. That is, the processes to form the second insulation layer 307 may also include: oxidizing a partial thickness of the second insulation thin film; and removing the oxidized part of the second insulation thin film by a wet etching process.

Figure 8:
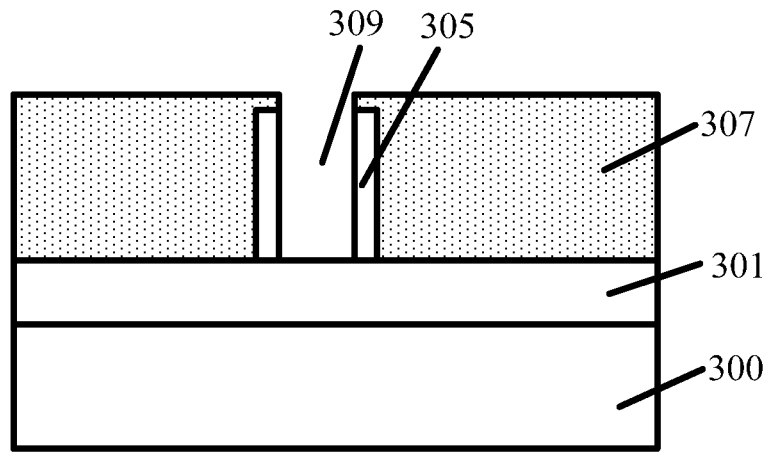
Figure 11:
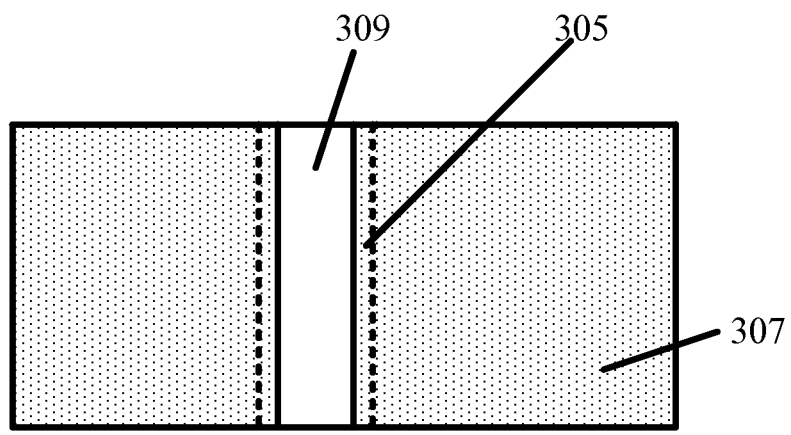
FIGS. 11-14 illustrate top-view structural diagrams of an exemplary semiconductor device manufacturing process consistent with the disclosed embodiments.

Returning to FIG. 4, after the formation of the second insulation layer 307, the hard mask layer 304 and the fin 303 are removed to form an opening exposing the sidewalls of the fully-depleted semiconductor layer 305 (S207). FIG. 8 shows an exemplary structure corresponding to S207, and FIG. 11 shows a top-view structure of the semiconductor device as shown in FIG. 8. In FIG. 11, the fully-depleted semiconductor layer 305 is defined by the dotted-line region.

As shown in FIG. 8 and FIG. 11, the hard mask layer 304 and the fin 303 are removed to form the opening 309 exposing the sidewalls of the fully-depleted semiconductor layer 305. That is, the hard mask layer 304 may be first removed and the fin 303 may then be removed to form the opening 309, which may be used to subsequently form a gate dielectric layer and a gate electrode layer. Further, because the hard mask layer 304 is made of a material different from that of the second insulation layer 307 and the fin 303 is made of a material different from that of the fully-depleted semiconductor layer 305, the process for removing the hard mask layer 304 and the fin 303 may be simple. For example, an etching process, such as an anisotropic dry etching process or wet etching process, may be used to remove the hard mask layer 304 and the fin 303.

In certain embodiments, the fin 303 is made of single-crystalline silicon and the fully-depleted semiconductor layer 305 is made of single-crystalline silicon germanium. In order not to damage the fully-depleted semiconductor layer 305 during the removal process of the fin 303, a reagent having a much faster etching rate to single-crystalline silicon than that to single-crystalline silicon germanium may be used, such as tetramethylammonium hydroxide (TMAH). Because TMAH has an etching rate ratio of around 70 for single-crystalline silicon vs. single-crystalline silicon germanium, no damages to the fully-depleted semiconductor layer 305 may occur during the removal process of the fin 303.

Further, in certain other embodiments, the fin 303 is made of single-crystalline silicon germanium and the fully-depleted semiconductor layer 305 is made of single-crystalline silicon. In order not to damage the fully-depleted semiconductor layer 305 during the removal process of the fin 303, a reagent having a much slower etching rate to single-crystalline silicon than that to single-crystalline silicon germanium may be chosen, such as hydrogen chloride at a temperature greater than 200° C. (Hot HCl). Because Hot HCl has an etching rate ratio of greater than 100 for single-crystalline silicon vs. single-crystalline silicon germanium, no damage to the fully-depleted semiconductor layer 305 may occur during the removal process of the fin 303.

Figure 12:
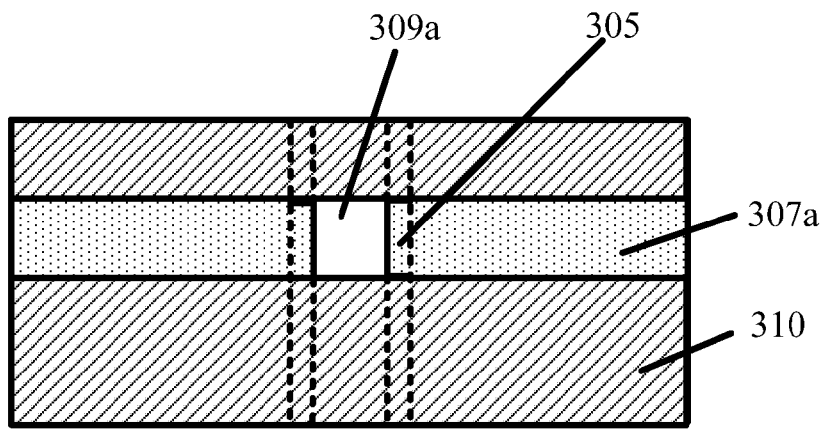

Returning to FIG. 4, after the fin 303 is removed to form an opening 309 and the sidewalls of the fully-depleted semiconductor layer 305 are exposed, a mask layer is formed on the surface of the second insulation layer 307 and part of the second insulation layer 307 and part of the opening 309 are exposed by the mask layer (S209). FIG. 12 shows a top-view structure corresponding to S209.

As shown in FIG. 12, a mask layer 310 is formed on the surface of the second insulation layer 307, exposing part of the second insulation layer 307a and part of the opening 309a, which may be used to subsequently form a gate dielectric layer and a gate electrode layer on the part of the second insulation layer 307a and the part of the opening 309a. The mask layer 310 may be made of a photoresist material or silicon nitride. Further, the mask layer 310 may be made by a deposition process.

Figure 9:
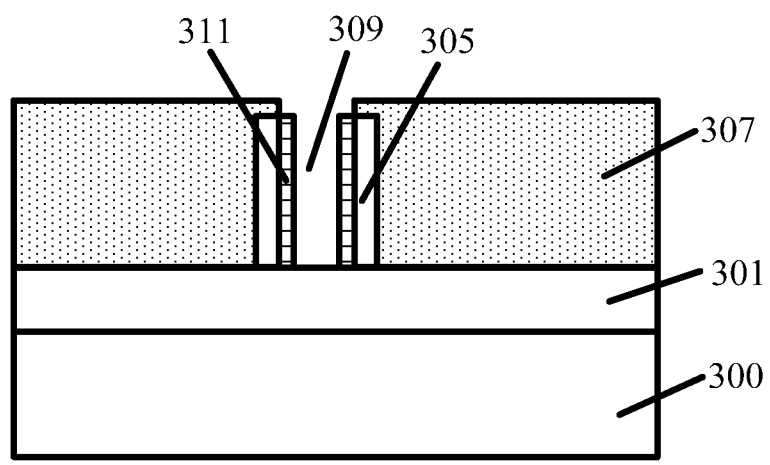

Returning to FIG. 4, after the formation of the mask layer 310, a gate dielectric layer is formed on the sidewalls of the fully-depleted semiconductor layer 305 in the exposed part of the opening 309a (S211). FIG. 9 shows an exemplary structure corresponding to S211, and FIG. 13 shows a top-view structure of the semiconductor device as shown in FIG. 9.

Figure 13:
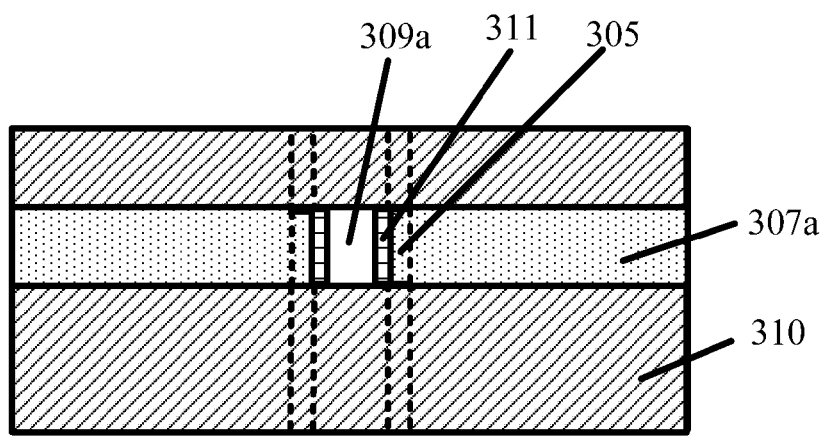

As shown in FIG. 9 and FIG. 13, the gate dielectric layer 311 is formed on the sidewalls of the fully-depleted semiconductor layer 305 in the exposed part of the opening 309a. The gate dielectric layer 311 may be used to insulate or isolate a gate electrode layer and the fully-depleted semiconductor layer 305. Further, the gate dielectric layer 311 may also be used to insulate or isolate the channel regions on both sides of the gate electrode layer, preventing interference between the channel regions.

The gate dielectric layer 311 may be made of silicon oxide, silicon nitride, silicon oxynitride, or any appropriate high-K dielectric materials, such as one or more of $SiO_2$, SiON, $HfO_2$, $ZrO_2$, HfSiO, and HfSiON. In one embodiment, the gate dielectric layer 311 may be made of $HfO_2$ having a high dielectric constant.

The gate dielectric layer 311 may be formed by a deposition process, an oxidation process, or a nitridation process. In one embodiment, the gate dielectric layer 311 may be formed by a deposition process, and the gate dielectric layer 311 may be formed on the sidewalls of the fully-depleted semiconductor layer 305.

Further, the gate dielectric layer 311 may also cover the surface of the first insulation layer 301 on the bottom of the partial opening 309a, the partial surface 307a of the second insulation layer 307, and the sidewalls of the mask layer 310. The partial coverage of the gate dielectric layer 311 on the first insulation layer 301, the partial surface 307a of the second insulation layer 307, and the sidewalls of the mask layer 310 does not have negative impact on the resulting semiconducting device.

Figure 10:
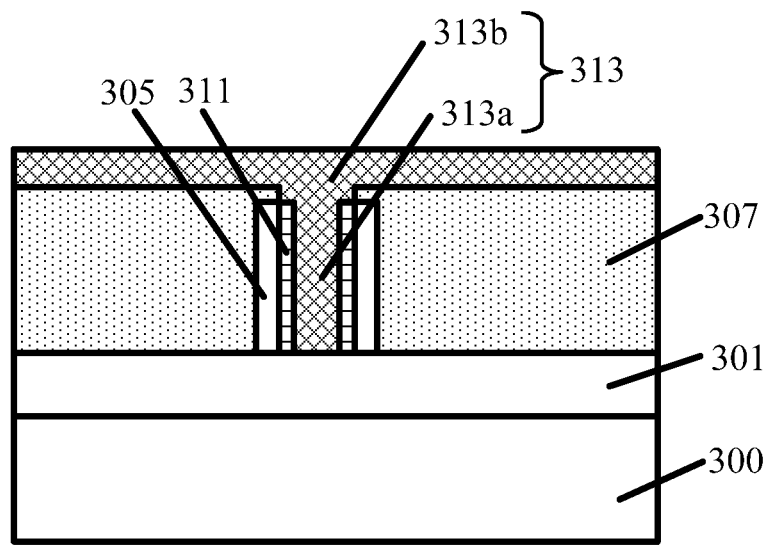

Returning to FIG. 4, after the formation of the gate dielectric layer 311, a gate electrode layer is formed to cover the gate dielectric layer 311 (S213). FIG. 10 shows an exemplary structure corresponding to S213, and FIG. 14 shows a top-view structure of the semiconductor device as shown in FIG. 10.

Figure 14:
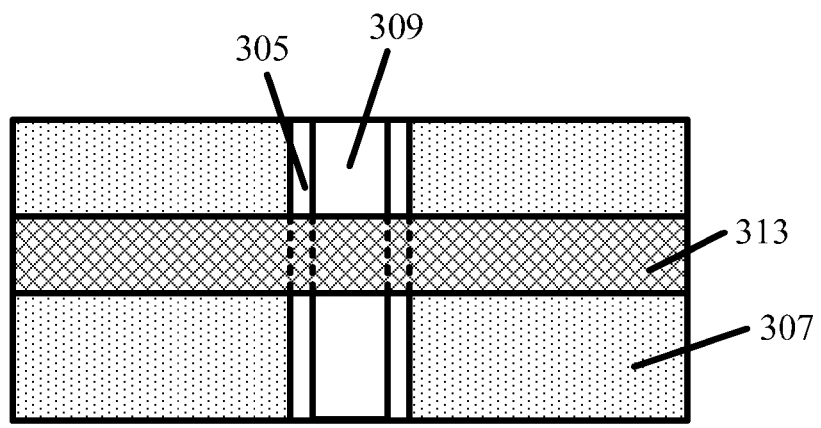

As shown in FIG. 10 and FIG. 14, a gate electrode layer 313 is formed to cover the gate dielectric layer 311. The gate electrode layer 313 may be used to form the gate of the resulting semiconductor device. The materials to form the gate electrode layer may include one or more of polycrystalline silicon, tungsten (W), copper (Cu), silver (Ag), TiN, TaN, and TiAl. In one embodiment, to form a semiconductor device with a desired performance, the gate electrode 313 may be made of a metal, such as W, Cu, or Ag. The gate electrode layer 313 may be formed by a deposition process, such as a flowable chemical vapor deposition (flowable CVD) process.

In certain embodiments, the gate electrode layer 313 is formed by a gate last process. Particularly, a dummy-gate structure (not shown) is first formed on surface of the gate dielectric layer 311 in the partial opening 309a (FIG. 13), surface of the first insulation layer 301, and part of the second insulation layer 307a (FIG. 13). After forming the dummy-gate structure, the mask layer 310 and the second insulation layer 307 underneath the mask layer 310 are removed to expose the full-depleted semiconductor layer 305 on both sides of the dummy-gate structure. Source/drain regions (not shown) are formed in the fully-depleted semiconductor layer 305 on both sides of the dummy-gate structure. Further; the dummy-gate structure is removed to form the gate electrode layer 313 covering the gate dielectric layer 311.

Further, when forming the source/drain regions, after removing the mask layer, the openings on both sides of the dummy-gate structure are filled with a semiconductor material to form a middle layer (not shown), and doping ions are implanted into the middle layer on both sides of the dummy-gate structure and into the fully-depleted semiconductor layer 305 to form the source/drain regions.

Alternatively or optionally, the gate dielectric layer 311 may also be formed by a gate last process. That is, a dummy-gate structure (not shown) is formed on sidewalls of the fully-depleted semiconductor layer 305 in the partial opening 309a, surface of the first insulation layer 301, and part of surface of the second insulation layer 307a. After forming the dummy-gate structure, the mask layer 310 and the second insulation layer 307 underneath the mask layer 310 are removed to expose the full-depleted semiconductor layer 305 on both sides of the dummy-gate structure. Source/drain regions (not shown) are then formed in the fully-depleted semiconductor layer 305 on both sides of the dummy-gate structure. After the source/drain regions are formed, the dummy-gate structure is removed, and the gate dielectric layer 311 is formed on the sidewalls of the fully-depleted semiconductor layer 305 in the partial opening 309a. The gate electrode layer 313 covering the gate dielectric layer 311 and the part of surface of the second insulation layer 307a is then formed.

As shown in FIG. 10, in certain embodiments, the gate electrode layer 313 may include a first sub-gate electrode layer 313a located in the opening 309 and a second sub-gate electrode layer 313b located on the surface of the first sub-gate electrode layer 313a. The second sub-gate electrode layer 313b may cover the second insulation layer 307.

Further, the gate electrode layer 313 may include one or more first sub-gate electrode layer 313a. The gate width of the resulting semiconductor device may be related to the height of the fully-depleted semiconductor layer 305, the number of the fully-depleted semiconductor layer 305, and the number of the first sub-gate electrode layer 313a. For example, when the gate electrode layer 313 includes only one first sub-gate electrode layer 313a and the fully-depleted semiconductor layer 305 is formed on only one side of the first sub-gate electrode layer 313a, the gate width of the resulting semiconductor device is the same as the height of the fully-depleted semiconductor layer 305.

When the gate electrode layer 313 includes only one first sub-gate electrode layer 313a and the fully-depleted semiconductor layer 305 is formed on both sides of the first sub-gate electrode layer 313a, the gate width of the resulting semiconductor device is twice as the height of the fully-depleted semiconductor layer 305. When the gate electrode layer 313 includes three first sub-gate electrode layers 313a and the fully-depleted semiconductor layer 305 is formed on both sides of each first sub-gate electrode layer 313a, the gate width of the resulting semiconductor device is six times of the height of the fully-depleted semiconductor layer 305. In this way, the gate width of the resulting semiconductor device may be effectively increased, and the stability of the semiconductor device can be significantly improved.

Also, to effectively adjust the power function of the resulting semiconductor device and to further improve the performance of the semiconductor device, the manufacturing process also includes: prior to the formation of the gate electrode layer 313, forming a functional layer (not shown) covering the gate dielectric layer 311. The functional layer may include a single layer or multi-layer stacking structure, and the materials to form the functional layer may include one or more of TiN, TaN, and TiAl.

Thus, a semiconductor device according to the disclosed embodiments can be formed. The disclosed structures and manufacturing methods may provide many advantages over current technologies. By first forming the fin, followed by forming the fully-depleted semiconductor layer on the sidewalls of the fin, removing the fin to form an opening, forming a gate dielectric layer on the sidewalls of the fully-depleted semiconductor layer in the opening, and forming a gate electrode layer covering the gate dielectric layer, the simple manufacturing process can be used to form the fully depleted semiconductor device. Because the channel regions of the semiconductor devices are formed by the fully depleted semiconductor layer, the semiconductor device has a lower electric field, a higher transconductance, a better short channel characteristic, and an ideal sub-threshold slope, etc., and the stability of the semiconductor device is also improved. In addition, the gate width of the semiconductor device is increased and, because the isolation provided by the gate dielectric layer, the interference of channel regions on two sides of the gate electrode layer is small, further improving the stability of the semiconductor device.

Further, formed by a selective epitaxial deposition process, the fully-depleted semiconductor layer 305 has an excellent uniformity in thickness, thus greatly improving the stability of the resulting semiconductor device. A gate dielectric layer and a fully-depleted semiconductor layer are formed on at least one side of the gate electrode layer, and the gate width of the semiconductor device is at least the height of the fully-depleted semiconductor layer. Having a size at least as the height of the fully-depleted semiconductor layer, the gate width has been effectively increased, thus further improving the stability of the semiconductor device. Other applications and advantages are obvious to those skilled in the art.

What is claimed is:

1. A semiconductor device, comprising:
   a semiconductor substrate;
   a first insulation layer formed on the semiconductor substrate;
   a second insulation layer formed on the first insulation layer having at least one opening exposing a surface portion of the first insulation layer;
   a fully-depleted semiconductor layer forming sidewalls of the opening within the second insulation layer and on the first insulation layer;
   a gate dielectric layer formed on part of sidewalls of the fully-depleted semiconductor layer such that the part of the sidewalls of the fully-depleted semiconductor layer form channel regions of the semiconductor device; and
   a gate electrode layer covering the gate dielectric layer.

2. A semiconductor device according to claim 1, wherein the opening is formed by:
   forming a fin on the surface of the first insulation layer;
   forming the fully-depleted semiconductor layer on sidewalls of the fin, and the fully-depleted semiconductor layer having a material different from that of the fin;
   forming the second insulation layer covering the fully-depleted semiconductor layer; and
   removing the fin to form the opening exposing sidewalls of the fully-depleted semiconductor layer.

3. A semiconductor device according to claim 1, wherein the thickness of the fully-depleted semiconductor layer is in the range of approximately 1 nm-10 nm.

4. A semiconductor device according to claim 1, wherein the fully-depleted semiconductor layer is made of single-crystalline silicon, silicon germanium (SiGe), silicon carbon, carbon doped silicon, or any of Group III-V compounds.

5. A semiconductor device according to claim 1, wherein the gate dielectric layer include one or more of $SiO_2$, SiON, $HfO_2$, $ZrO_2$, HfSiO, and HfSiON.

6. A semiconductor device according to claim 1, wherein the gate electrode layer include one or more of polycrystalline silicon, W, Cu, Ag, TiN, TaN, or TiAl.

7. A semiconductor device according to claim 1, wherein the gate electrode layer further includes: a first sub-gate electrode layer extending through and covering the insulation layer; and a second sub-gate electrode layer connecting the first sub-gate electrode layer.

8. A semiconductor device according to claim 1, wherein the device also includes: a functional layer formed between the gate electrode layer and the gate dielectric layer; and the functional layer is made of a material including one or more of TiN, TaN, and TiAl.

* * * * *